(12) United States Patent
Meng et al.

(10) Patent No.: US 11,959,970 B2
(45) Date of Patent: Apr. 16, 2024

(54) METHOD AND DEVICE FOR CAPACITY DEGRADATION PREDICTION OF LITHIUM-ION BATTERY

(71) Applicant: Beijing Institute of Technology, Beijing (CN)

(72) Inventors: Huixing Meng, Beijing (CN); Mengyao Geng, Beijing (CN); Cheng Wang, Beijing (CN); Jinduo Xing, Beijing (CN)

(73) Assignee: Beijing Institute of Technology, Beijing (CN)

( * ) Notice: Subject to any disclaimer, the term of this patent is extended or adjusted under 35 U.S.C. 154(b) by 0 days.

(21) Appl. No.: 18/300,116

(22) Filed: Apr. 13, 2023

(65) Prior Publication Data

US 2023/0333172 A1 Oct. 19, 2023

(30) Foreign Application Priority Data

Apr. 13, 2022 (CN) .......................... 202210389369.0

(51) Int. Cl.
*G01R 31/387* (2019.01)
*G01R 31/367* (2019.01)

(52) U.S. Cl.
CPC ......... *G01R 31/387* (2019.01); *G01R 31/367* (2019.01)

(58) Field of Classification Search
CPC .. G01R 31/387; G01R 31/367; G01R 31/392; Y02E 60/10
See application file for complete search history.

(56) References Cited

U.S. PATENT DOCUMENTS

| 10,578,675 | B2 * | 3/2020 | Liang | H02J 7/0048 |
| 11,796,597 | B2 * | 10/2023 | Xiong | G01R 31/3828 |
| 2022/0114421 | A1 * | 4/2022 | Li | G06N 3/044 |

FOREIGN PATENT DOCUMENTS

| CN | 103616642 A | 3/2014 |
| CN | 109946612 A | 6/2019 |
| CN | 112949068 A | 6/2021 |

* cited by examiner

*Primary Examiner* — An H Do
(74) *Attorney, Agent, or Firm* — Nitin Kaushik

(57) ABSTRACT

One or more embodiments of the present specification provide a method and device for capacity degradation prediction of a lithium-ion battery. The method comprises the following steps: acquiring an original battery discharge capacity; decomposing the original battery discharge capacity through a predetermined mode decomposition method to obtain battery discharge capacities composed of a plurality of different frequency signals; inputting the respective frequency signals into a pre-constructed capacity prediction model to obtain capacity prediction results corresponding to the respective frequency signals; selecting capacity prediction result that satisfies a predetermined relevance condition corresponding to the respective frequency signals; and reconstructing the finally predicted battery discharge capacity according to the capacity prediction result that satisfies the predetermined relevance condition.

4 Claims, 4 Drawing Sheets

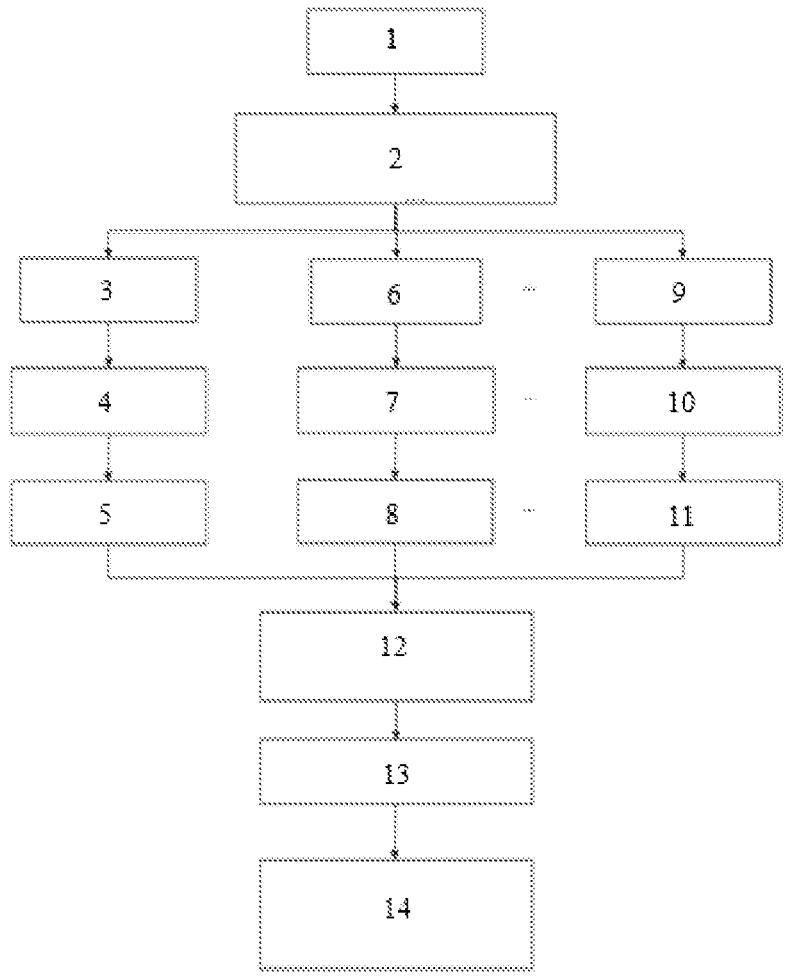

1. Original capacity time series
2. CEEMDAN-based multi-scale time series decomposition: $EEMDAN(S(t)) = \sum_{i=1}^{k} d_i(t) + r_k(t)$
3. Global degeneration component $r_k(t)$
4. Capacity prediction model
5. Capacity prediction result $r'_k(t)$
6. $d1(t)$ Local fluctuation component $d1(t)$
7. Capacity prediction model
8. Capacity prediction result $d'1(t)$
9. Local fluctuation component $dk(t)$
10. Capacity prediction model
11. Capacity prediction result $d'k(t)$
12. Calculate a correlation coefficient between each component and the original battery discharge capacity
13. Screen highly correlated components according to the correlation coefficient
14. Reconstruct the predicted battery discharge capacity $S'(t) = \sum_{i=1}^{N} d'_i(t) + r'_k(t)$

FIG. 2

METHOD AND DEVICE FOR CAPACITY DEGRADATION PREDICTION OF LITHIUM-ION BATTERY

CROSS-REFERENCE TO RELATED APPLICATIONS

The application claims priority to Chinese patent application No. 202210389369.0, filed on Apr. 13, 2022, the entire contents of which are incorporated herein by reference.

TECHNICAL FIELD

One or more embodiments of the present specification relate to the technical field of batteries, in particular to a method and device for capacity degradation prediction of a lithium-ion battery.

BACKGROUND

Lithium-ion batteries are widely used in household and engineering fields due to their advantages of high energy density, longevity, and low cost. As usage time increases, there is a possibility of accidents. Predicting the capacity degradation of the battery can indirectly estimate the remaining service life of the battery, so as to adjust the battery replacement time in time and ensure normal use functions. Therefore, how to accurately predict capacity degradation trend of the battery is a problem that needs to be solved.

SUMMARY

In view of this, objects of one or more embodiments of the present specification relate to a method and device for predicting capacity degradation of a lithium-ion battery, which can predict capacity degradation trend of the battery.

Based on the above objects, one or more embodiments of the present specification provide a method for capacity degradation prediction of a lithium-ion battery. The method comprises:

acquiring an original battery discharge capacity;

decomposing the original battery discharge capacity through a predetermined mode decomposition method to obtain battery discharge capacities composed of a plurality of different frequency signals;

inputting the respective frequency signals into a pre-constructed capacity prediction model to obtain capacity prediction results corresponding to the respective frequency signals;

selecting the capacity prediction result that satisfies a predetermined relevance condition corresponding to the respective frequency signals; and reconstructing the predicted battery discharge capacity according to the capacity prediction result that satisfies the predetermined relevance condition.

Optionally, the step of decomposing the original battery discharge capacity through the predetermined mode decomposition method to obtain the battery discharge capacities composed of the plurality of different frequency signals comprises:

decomposing original battery discharge capacity $S(t)$ through a CEEMDAN mode decomposition algorithm to obtain a battery discharge capacity composed of a plurality of high-frequency signals and one low-frequency signal, expressed as:

$$CEEMDAN(S(t)) = \Sigma_{i=1}^{k} d_i(t) + r_k(t) \qquad (1)$$

in which k is a number of decomposed IMF components, $d_i(t)$ stands for the high-frequency signal corresponding to the $i^{th}$ IMF component, and $r_k(t)$ represents the low-frequency signal corresponding to residual signal.

Optionally, the capacity prediction model is constructed based on an ANFIS model; and the step of inputting the respective frequency signals into the pre-constructed capacity prediction model to obtain the capacity prediction results corresponding to the respective frequency signals comprises:

dividing each frequency signal into a training set and a test set, taking the training set and the test set as inputs of the capacity prediction model, and outputting the capacity prediction results of the corresponding frequency signals by the capacity prediction model.

Optionally, the step of selecting the capacity prediction result that satisfies the predetermined relevance condition from the capacity prediction results corresponding to the respective frequency signals comprises:

calculating a correlation coefficient between each frequency signal and the original battery discharge capacity respectively;

selecting the frequency signal whose correlation coefficient is greater than or equal to a preset correlation threshold; and taking the capacity prediction result corresponding to the selected frequency signal as the capacity prediction result that satisfies the predetermined relevance condition.

Optionally, the step of reconstructing the predicted capacity according to the capacity prediction result that satisfies the predetermined relevance condition comprises:

reconstructing the predicted capacity according to the capacity prediction result that satisfies the predetermined relevance condition and the capacity prediction result corresponding to the low-frequency signal, expressed as:

$$S'(t) = \Sigma_{m=1}^{N} d'_m(t) + r_k'(t) \qquad (16)$$

in which $S'(t)$ is the reconstructed battery discharge capacity, N is a number of capacity prediction results that satisfy the predetermined relevance condition, $d'_m(t)$ is the $m^{th}$ capacity prediction result that satisfies the predetermined relevance condition, and $r_k'(t)$ is the capacity prediction result corresponding to the low-frequency signal.

An embodiment of the present specification further provides a device for capacity degradation prediction of a lithium-ion battery. The device comprises:

an acquisition module, configured to acquire an original battery discharge capacity;

a decomposition module, configured to decompose the original battery discharge capacity through a predetermined mode decomposition method to obtain battery discharge capacity composed of a plurality of different frequency signals;

a prediction module, configured to input the respective frequency signals into a pre-constructed capacity prediction model to obtain capacity prediction results corresponding to the respective frequency signals;

a screening module, configured to select a capacity prediction result that satisfies a predetermined relevance condition from the capacity prediction results corresponding to the respective frequency signals; and a reconstruction module, configured to reconstruct a predicted battery discharge capacity according to the capacity prediction result that satisfies the predetermined relevance condition.

Optionally, the decomposition module is configured to decompose the original battery discharge capacity $S(t)$ through CEEMDAN to obtain battery discharge capacity composed of a plurality of high-frequency signals and a low-frequency signal, expressed as:

$$CEEMDAN(S(t)) = \sum_{i=1}^{k} d_i(t) + r_k(t) \quad (1)$$

in which k is a number of decomposed IMF components, $d_i(t)$ stands for the high-frequency signal corresponding to the $i^{th}$ IMF component, and $r_k(t)$ represents the low-frequency signal corresponding to residual signal.

Optionally, the prediction module is configured to divide each frequency signal into a training set and a test set, take the training set and the test set as inputs of the capacity prediction model, and output the capacity prediction results of the corresponding frequency signals by the capacity prediction model, wherein the capacity prediction model is constructed based on an ANFIS model.

Optionally, the screening module is configured to calculate a correlation coefficient between each frequency signal and the original battery discharge capacity respectively; select the frequency signal which correlation coefficient is greater than or equal to the predetermined correlation threshold; and take the capacity prediction result corresponding to the selected frequency signal as a capacity prediction result that satisfies the predetermined relevance condition.

Optionally, the reconstruction module is configured to reconstruct the predicted battery discharge capacity according to the capacity prediction result that satisfies the predetermined relevance condition and the capacity prediction result corresponding to the low-frequency signal, expressed as:

$$S'(t) = \sum_{m=1}^{N} d_m'(t) + r_k'(t) \quad (16)$$

in which S'(t) is the reconstructed battery discharge capacity, N is a number of capacity prediction results that satisfy the predetermined relevance condition, $d_m'(t)$ is the capacity prediction result that satisfies the predetermined relevance condition, and $r_k'(t)$ is the capacity prediction result corresponding to the low-frequency signal.

As can be seen from the above, one or more embodiments of the present specification provide a method and device for capacity degradation prediction of a lithium-ion battery. The method comprises the following steps: decomposing original battery discharge capacity through predetermined mode decomposition method to obtain battery capacity composed of a plurality of different frequency signals; inputting frequency signals into a pre-constructed capacity prediction model to obtain capacity prediction results corresponding to the respective frequency signals; selecting prediction result that satisfies the predetermined relevance condition corresponding to the frequency signals; and reconstructing the predicted battery discharge capacity according to the capacity prediction result that satisfies the predetermined relevance condition. According to the method provided in the present embodiment, the capacity degradation trend is predicted in combination with three stages of charge-discharge cycle process of the lithium-ion battery and in consideration of the effects of capacity regeneration thus the prediction result is more accurate.

BRIEF DESCRIPTION OF DRAWINGS

To describe one or more embodiments of the present specification or the technical solutions in the prior art more clearly, the following briefly introduces the accompanying drawings required for describing the embodiments or the descriptions in the prior art. Apparently, the accompanying drawings in the following description show merely some embodiments of the present specification, and a person of ordinary skill in the art may still derive other drawings from these accompanying drawings without creative efforts.

FIG. 2 is a schematic flowchart of the method according to another embodiment of the present specification;

DETAILED DESCRIPTION OF THE EMBODIMENTS

To make the objectives, technical solutions, and advantages of the present disclosure clearer, the following describes the present disclosure in detail in conjunction with specific embodiments and with reference to the accompanying drawings.

It should be noted that the technical and scientific terms as used in one or more embodiments of the present specification should have the meanings as commonly understood by those of ordinary skill in the art of the present disclosure, unless otherwise defined. The words "first", "second" and similar terms used in one or more embodiments of the present specification do not denote any order, quantity, or importance, and are merely used to distinguish different components. The word "comprise", "including" or similar terms mean that elements or objects appearing before the term cover the listed elements or objects and its equivalents appearing after the term while other elements or objects are not excluded. The word "connected" or "coupled" and similar terms are not limited to physical or mechanical connections, and may include electrical connection and the connection may be direct or indirect. "Upper", "lower", "left", "right" and the like are only used to indicate the relative positional relationship, and when the absolute position of a described object changes, the relative positional relationship may also change accordingly.

In related technologies, with the progress of internal chemical reaction of lithium-ion battery, capacity is declining. However, when the battery is shelved for some time, the available capacity of the battery in the next cycle can be restored and higher than the capacity before shelved, and this phenomenon is called capacity regeneration. In the actual use process, the operating process of the lithium-ion battery includes three stages of charging, discharging, and shelving, wherein a shelving time is generally greater than the charging/discharge time. Therefore, the capacity regeneration phenomenon is widespread in lithium-ion batteries. General methods only consider a global degradation trend of battery capacity, but rarely analyze the capacity regeneration phenomenon in the battery shelving stage, resulting in inaccurate prediction results.

In view of this, the present application provides a method for capacity degradation prediction in combination with the regeneration phenomenon, which is more in line with the actual situations of the battery, is more accurate in prediction results and has higher practical application value.

The technical solution of the present application will be further described in detail below in conjunction with the specific embodiments.

Figure 1:
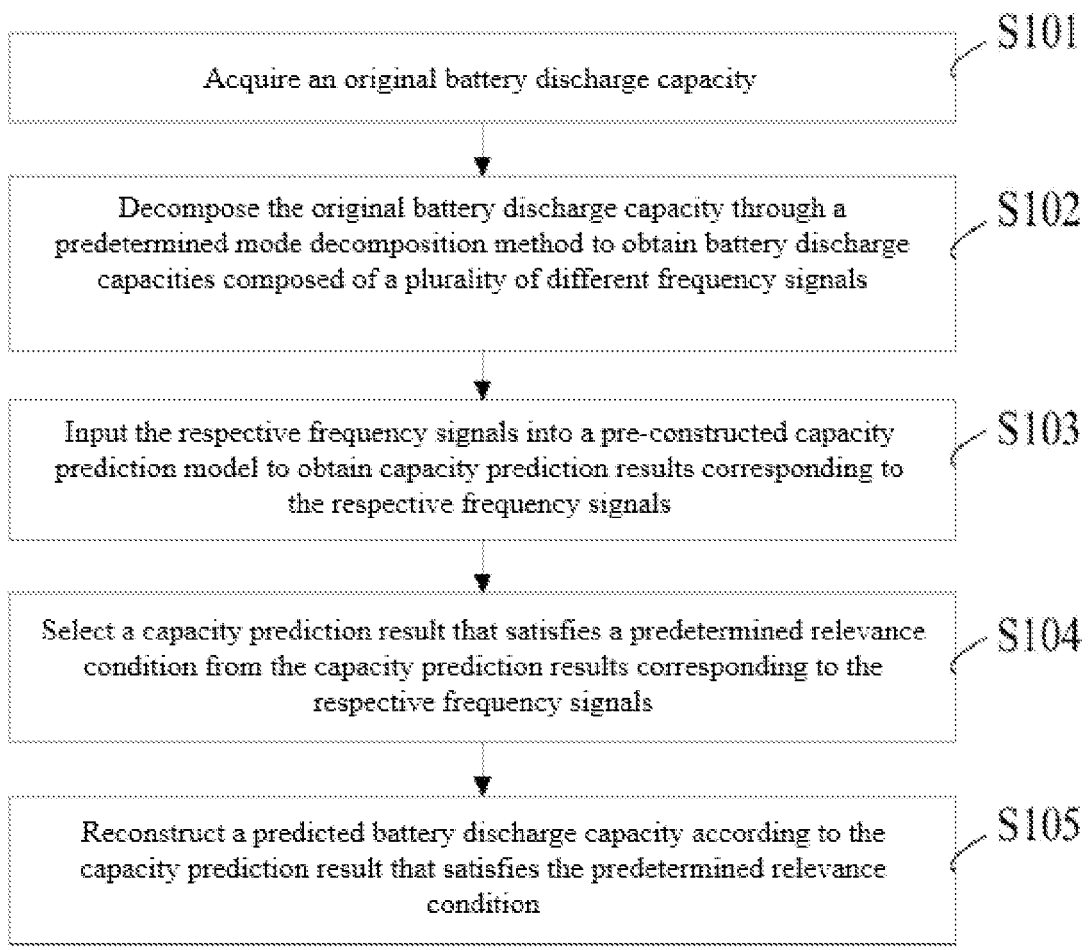
FIG. 1 is a schematic flowchart of the method according to one or more embodiments of the present specification.

As shown in FIG. 1 and FIG. 2, the present application provides a method for capacity degradation prediction of a lithium-ion battery. The method comprises the following steps S101-S105.

S101: Acquire an original battery discharge capacity.

In the present embodiment, firstly, the original battery discharge capacity is acquired from battery charge and discharge experimental data. In some modes, operating state signal of the battery can be collected in real time, and the battery discharge capacity can be calculated by using a capacity estimation method according to the operating state signal. The operating state signal may be an operating current, a terminal voltage or other parameters.

S102: Decompose the original battery discharge capacity through a predetermined mode decomposition method to obtain battery discharge capacities composed of a plurality of different frequency signals.

In the present embodiment, the original battery discharge capacity is decomposed to obtain battery discharge capacity signals of a plurality of different frequency components. A low-frequency signal is used to characterize a global degradation trend, and high-frequency signals can characterize the local capacity regeneration trend. The correlations between the battery discharge capacity signals of different frequency components and the original battery discharge capacity are different. According to the correlations, the original battery discharge capacity can be denoised.

In some modes, a complete ensemble empirical mode decomposition with adaptive noise (CEEMDAN) algorithm is used to decompose an original battery discharge capacity S(t) to obtain a plurality of mode components that can represent the original battery discharge capacity, expressed as:

$$\text{CEEMDAN}(S(t)) = \sum_{i=1}^{k} d_i(t) + r_k(t) \quad (1)$$

in which k is a number of decomposed intrinsic mode function (IMF) components, $d_i(t)$ is the $i^{th}$ IMF component, and $r_k(t)$ is a residual signal. That is, the decomposed battery discharge capacity is composed of k+1 battery discharge capacity signals with different frequency components. The battery discharge capacity signals with different frequency components can be expressed by k IMF components and one residual. The IMF component $d_i(t)$ is a high-frequency signal that characterizes a local fluctuation trend of battery discharge capacity. The residual signal $r_k(t)$ is a low-frequency signal that characterizes a global degradation trend of battery discharge capacity.

S103: Input the respective frequency signals into a pre-constructed capacity prediction model to obtain prediction results corresponding to the respective frequency signals.

The decomposed frequency signals are respectively inputted into a pre-trained capacity prediction model, and capacity prediction results corresponding to the respective frequency signals are outputted.

In some implementations, a capacity prediction model can be constructed based on adaptive neuro-fuzzy inference system (ANFIS) model. In the training process, ANFIS is trained by taking the same frequency signal at first $(h-1)^{th}$ moments as an input and the frequency signal at an $h^{th}$ moment as output of the model, so as to obtain the capacity prediction results, which may be expressed as:

$$d_i(h) = \text{ANFIS}(d_i(1), d_i(2), \ldots, d_i(h-1)) \quad (2)$$

$$r_k(h) = \text{ANFIS}(r_k(1), r_k(2), \ldots, r_k(h-1)) \quad (3)$$

in which $d_i(h)$ represents the capacity prediction result of the $i^{th}$ IMF component at the $h^{th}$ moment obtained by inputting the $i^{th}$ IMF component (i.e., the $i^{th}$ frequency signal) of the first h−1 moments into the capacity prediction model ANFIS. $r_k(h)$ represents a capacity prediction result of a residual signal at the $h^{th}$ moment obtained by inputting the residual signals at the first h−1 moments into the capacity prediction model.

S104: Select a capacity prediction result that satisfies a predetermined relevance condition from the capacity prediction results corresponding to the respective frequency signals.

S105: Reconstruct the prediction results according to correlation coefficient that satisfies the predetermined relevance condition.

In the present embodiment, given different correlations between different frequency signals and the original battery discharge capacity, the lower the correlation is, the more likely it is that noise can be filtered. The capacity prediction results with a certain correlation with the original battery discharge capacity are selected from the capacity prediction results of the respective frequency signals according to the predetermined relevance condition, so as to reconstruct the battery discharge capacity as a finally predicted battery discharge capacity.

The method for capacity degradation prediction of the lithium-ion battery as provided in the present embodiment comprises the following steps: acquiring an original battery discharge capacity; decomposing the original battery discharge capacity through a predetermined mode decomposition method to obtain battery discharge capacities composed of a plurality of different frequency signals; inputting the respective frequency signals into a pre-constructed capacity prediction model to obtain capacity prediction results corresponding to the respective frequency signals; selecting capacity prediction result that satisfies a predetermined relevance condition corresponding to the respective frequency signals; and reconstructing the predicted battery discharge capacity according to the capacity prediction result that satisfies the predetermined relevance condition. According to the method provided in the present embodiment, a capacity degradation trend is predicted in combination with three stages of a charge-discharge cycle process of the lithium-ion battery and in consideration of the effects of capacity regeneration, thus the prediction result is more accurate.

The prediction method of the present application is described in detail in conjunction with the accompanying drawings and specific embodiments.

As shown in FIG. 2, the original battery discharge capacity S(t) is decomposed by using the CEEMDAN algorithm on the basis of the original battery discharge capacity, which specifically comprises:

adding a noise signal to the original battery discharge capacity S(t) to obtain a battery discharge capacity $S^{(j)}(t)$ in response to the increase in noise:

$$S^{(j)}(t) = S(t) + \beta_0 w^{(j)} \quad (4)$$

in which $w^{(j)}$ represents a white noise that satisfies the standard normal distribution N(0,1) for j times, j=1, ..., L, L is an integer, and $\beta_0$ is a noise coefficient;

performing empirical mode decomposition (EMD) on the battery discharge capacity $S^{(j)}(t)$ added with the noise to obtain a first-order component $d^{(j)}(t)$, and calculating a mean value of L first-order components to obtain a first IMF component of CEEMDAN:

$$d_1(t) = \frac{1}{L}\sum_{i=1}^{L} d_1^{(j)}(t) \quad (5)$$

calculating a first residual of the first-order IMF component:

$$r_1(t)=S(t)-d_1(t) \quad (6)$$

wherein the first mode generated by EMD decomposition is presented as follows:

$$IMF_1=r_1(t)+\beta_1 E_1(w^{(j)}) \quad (7)$$

in which $E_k(\bullet)$ represents a $k^{th}$ IMF component obtained by EMD decomposition, and $\beta_1$ is the noise coefficient of the first mode;

calculating a second mode:

$$d_2(t) = \frac{1}{L}\sum_{j=1}^{L} E_1\big(r_1(t)+\beta_1 E_1(w^{(j)})\big) \quad (8)$$

calculating a $k^{th}$ residual:

$$r_k(t)=r_{(k-1)}(t)-d_k(t) \quad (9);$$

and repeating the above EMD decomposition and residual calculation processes until the EMD cannot decompose any residual. Equation (1) refers a plurality of modes that can represent the original battery discharge capacity, including different high-frequency signals and low-frequency signals.

Each frequency signal of the original battery discharge capacity is respectively inputted into the pre-trained capacity prediction model, and the capacity prediction model outputs a capacity prediction result corresponding to each frequency signal.

The capacity prediction model is realized based on ANFIS, including five layers: input layer, regular base layer, normalization layer, defuzzification layer and output layer. Specifically:

a two-input and single-output If-Then fuzzy rule corresponding to ANFIS is as follows:

$f_1$: If $x_1$ is $A_1$ and $x_2$ is $B_1$, then $f_1=p_1x_1+q_1x_2+r_1$ $f_2$: If $x_1$ is $A_2$ and $x_2$ is $B_2$, then $f_2=p_2x_1+q_2x_2+r_2$ The first layer of ANFIS is a square node, and $O_i$ is a membership function of a fuzzy subset $A_i$ (or $B_i$), which indicates the degree to input parameter $x_1$ (or $x_2$) satisfies the corresponding fuzzy subset. In some modes, each frequency signal is divided into a training set and a test set are inputted into the model as inputs $x_1$ and $x_2$ of the ANFIS model, respectively. ANFIS model outputs the capacity prediction result of each frequency signal.

Optionally, a bell-shaped membership function with a maximum value of 1 and a minimum value of 0 is selected. The bell-shaped membership function is specifically expressed as:

$$O_i^{(1)} = \begin{cases} \mu_{A_i}(x_1) = \left[1+\left(\frac{x_1-c_{1i}}{a_{1i}}\right)^{2b_{1i}}\right]^{-1} \\ \mu_{B_i}(x_2) = \left[1+\left(\frac{x_2-c_{2i}}{a_{2i}}\right)^{2b_{2i}}\right]^{-1} \end{cases}, i=1,2 \quad (10)$$

in which $\mu_{A_1}(x_1)$ is the bell-shaped membership function, indicating a degree to which the input parameter $x_1$ satisfies the fuzzy subset $A_i$; $\mu_{B_1}(x_2)$ is the bell-shaped membership function, indicating a degree to which the input parameter $x_2$ satisfies the fuzzy subset $B_i$; and $\{a_{1i}, b_{1i}, c_{1i}, a_{2i}, b_{2i}, c_{2i}\}$ are antecedent parameters that determine a shape of a membership function.

A second layer is circular nodes, which represent several If-Then rules generated by a Takagi-Sugeno fuzzy logic system. The nodes in this layer multiply signals inputted to the nodes in the first layer and pass a calculation result to the next layer, expressed as:

$$O_i^{(2)}=\omega_i=\Pi_{i=1}^{2} O_i^{(1)}=\mu_A(x_1)\mu_{B_i}(x_2), \ i=1,2 \quad (11)$$

The third layer is circular nodes, which take the calculation result of the second layer as an input to calculate a normalized value of each rule, and divide the output of the $i^{th}$ node by a sum of outputs of all nodes, expressed as:

$$o_i^{(3)}=\overline{\omega}_i=\omega_i/\Sigma_{i=1}^{2} 7_i \quad (12)$$

The fourth layer is square nodes, which perform weighted summation on inputs according to a rule, expressed as:

$$O_i^{(4)}=\overline{\omega}_i f_i=\overline{\omega}_i(p_ix_1+q_ix_2+r_i) \quad (13)$$

in which ($p_i$, $q_i$, $r_i$) are result parameters.

The fifth layer is a circular node, which is used to perform weighted accumulation on the output results of the fourth layer to obtain a capacity prediction result of the model, expressed as:

$$O_i^{(5)}=\Sigma_{i=1}^{2}\overline{\omega}_i f_i \quad (14)$$

In combination with formulas (2) and (3), $O_i^{(5)}$ represents the capacity prediction result at the next moment of a certain inputted frequency signal.

Each frequency signal of the original battery discharge capacity is inputted into the prediction model which is pre-trained based on ANFIS, and the capacity prediction model outputs capacity prediction results corresponding to the respective frequency signals.

In some embodiments, the step of selecting the capacity prediction result that satisfies the predetermined relevance condition corresponding to the respective frequency signals comprises:

calculating correlation coefficients between frequency signals and the original battery discharge capacity;

selecting the frequency signal whose correlation coefficient is greater than or equal to a preset correlation threshold; and selecting a capacity prediction result that satisfies the predetermined relevance condition from the capacity prediction results corresponding to the selected frequency signals.

In the present embodiment, correlation coefficient between the frequency signals and original battery discharge capacity is calculated, expressed as:

$$\rho_w = \frac{\sum_{t=1}^{n}\big(S(t)-\overline{S(t)}\big)\big(d_w(t)-\overline{d_w(t)}\big)}{\sqrt{\sum_{t=1}^{n}\sum\big(S(t)-\overline{S(t)}\big)^2\sum\big(d_w(t)-\overline{d_w(t)}\big)^2}} \quad (15)$$

in which $\rho_w$ is a correlation coefficient between a $w^{th}$ frequency signal and the original battery discharge capacity; $d_w(t)$ is a frequency signal corresponding to the $w^{th}$ IMF component; $\overline{d_w(t)}$ is a mean of $d_w(t)$; $S(t)$ is the original battery discharge capacity; $\overline{S(t)}$ is a mean of $S(t)$; and n is a total battery charge-discharge cycle time.

In some modes, correlation threshold is set. The correlation coefficients between each frequency signal and the original battery discharge capacity are compared with the correlation threshold. The frequency signal greater than or equal to the correlation threshold is selected; and the frequency signal less than the correlation threshold is removed.

In some embodiments, the predicted battery capacity is reconstructed according to the capacity prediction result that satisfies the predetermined relevance condition and the capacity prediction result corresponding to the low-frequency signal, expressed as:

$$S'(t)=\Sigma_{m=1}^{N}d_m'(t)+r_k'(t) \quad (16)$$

in which S'(t) is the reconstructed battery discharge capacity, N is a number of capacity prediction results that satisfy the predetermined relevance condition, $d_m'(t)$ is the capacity prediction result that satisfies the predetermined relevance condition, and $r_k'(t)$ is the capacity prediction result corresponding to the low-frequency signal.

The reconstructed capacity can eliminate the noisy part from the original battery discharge capacity, the reserved residual signal can characterize global long-term degradation trend, and the selected high-frequency signal can reflect capacity regeneration characteristic in the process of battery degradation, thereby improving the accuracy of capacity prediction in combination with actual battery charge and discharge situations.

The prediction performance can be evaluated based on the original battery discharge capacity and the reconstructed battery discharge capacity. Optionally, the prediction result of the battery discharge capacity is evaluated by using root mean square error (RMSE), expressed as:

$$RMSE = \sqrt{\frac{\sum_{t=1}^{n}(S'(t)-S(t))^2}{n}} \quad (17)$$

The advantages of the method in the present embodiment are described below in conjunction with experimental data.

The experimental data used in the present embodiment comes from NASA Battery Data Set. Based on the existing Gaussian process regression (GPR) model, CEEMDAN+GPR, ANFIS method and CEEMDAN+ANFIS method in the present specification, capacity is predicted taking battery B0005 as an example, wherein the prediction starting point is set to 50% of the total battery cycle, that is, 85 cycle. The prediction results are shown in Table 1. The remaining useful life (RUL) of the lithium-ion battery refers to the number of charge-discharge cycles experienced before the battery's health state degrades to a point where the device cannot continue to operate or a specified value (a failure threshold) under certain charge-discharge conditions.

TABLE 1

Battery prediction results of different methods.

| Prediction method | Prediction starting point | RUL | RMSE |
| --- | --- | --- | --- |
| GPR | 85 | 40 | 0.0222 |
| CEEMDAN + GPR | 85 | 40 | 0.0237 |
| ANFIS | 85 | 40 | 0.0162 |
| CEEMDAN + ANFIS | 85 | 40 | 0.0109 |

According to Table 1, compared with several existing prediction methods, the method of CEEMDAN+ANFIS provided in the present embodiment has lower RMSE in the prediction results.

Figure 3:
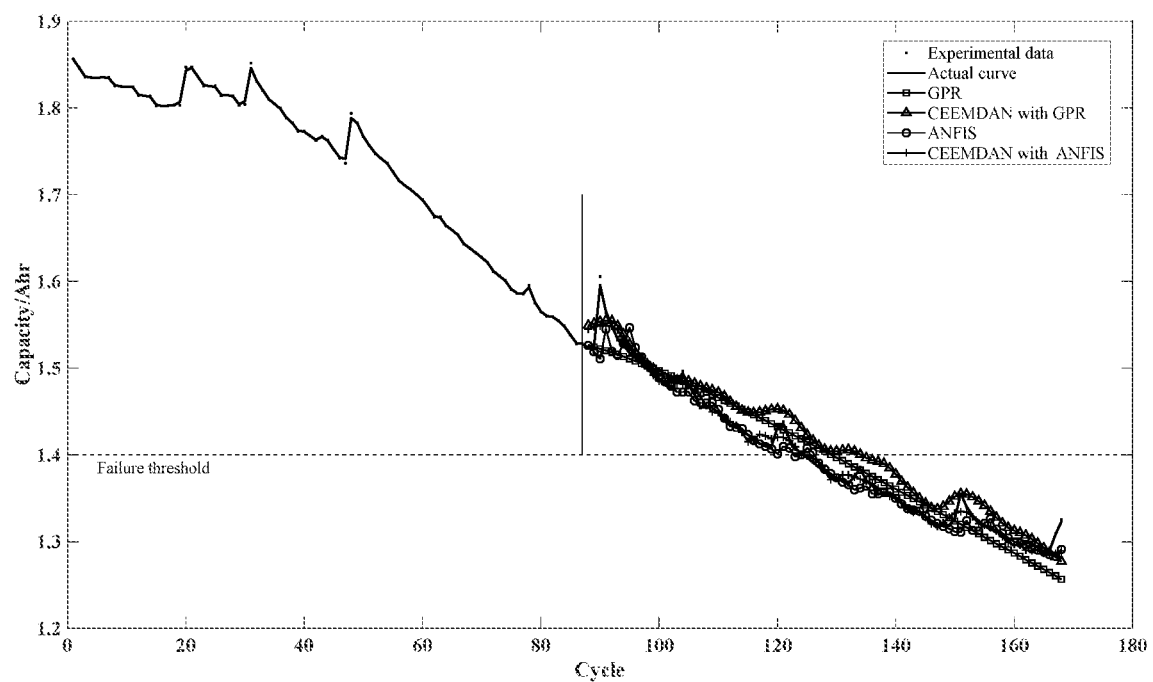
FIG. 3 is a schematic diagram of experimental results according to one or more embodiments of the present specification.

Combined with an experimental result diagram shown in FIG. 3, it can be seen that the CEEMDAN can solve the fluctuation problem of capacity regeneration, and ANFIS can respond to the mutation of capacity regeneration in time and transform the mutation into a smooth transition, so as to obtain stable and high-accuracy prediction results.

For different prediction starting point, the experimental results shown in Table 2 can be obtained:

TABLE 2

| Prediction results at different starting point moments | | |
| --- | --- | --- |
| Starting point | RUL | RMSE |
| 51 | 74 | 0.0100 |
| 68 | 56 | 0.0100 |
| 85 | 40 | 0.0109 |
| 102 | 22 | 0.0075 |
| 119 | 5 | 0.0077 |
| 135 | — | 0.0078 |

"—" indicates that failure threshold has been reached at this prediction starting point.

According to the experimental results, for different prediction starting point, RMSE of the obtained prediction result is stable within a certain range. The prediction results in the last 50% of the total cycle are smaller than the prediction results in the first 50%. It can be seen that the prediction method provided by the present embodiment, which fuse CEEMDAN and ANFIS, has good stability and effectiveness.

It should be noted that the specific embodiments of the present specification have been described above. Other embodiments fall within the scope of the appended claims. In some cases, the actions or steps described in the claims may be performed in a different order than in the embodiments and still achieve desired results. In addition, the processes described in the drawings can achieve the desired results without necessarily requiring the shown specific order or sequential order. In some embodiments, multitasking and parallel processing are also possible or may be advantageous.

Figure 4:
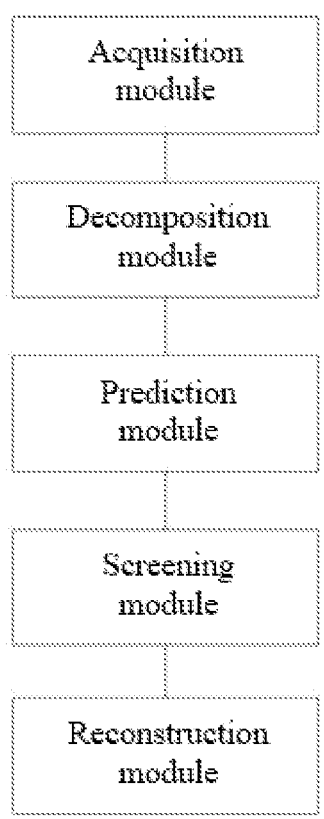
FIG. 4 is a structural block diagram according to one or more embodiments of the present specification.

As shown in FIG. 4, an embodiment of the present specification further provides a device for capacity degradation prediction of a lithium-ion battery. The device comprises:

an acquisition module, configured to acquire an original battery discharge capacity;

a decomposition module, configured to decompose the original battery discharge capacity through a predetermined mode decomposition method to obtain battery discharge capacity composed of a plurality of different frequency signals;

a prediction module, configured to input the respective frequency signals into a pre-constructed capacity prediction model to obtain capacity prediction results corresponding to the respective frequency signals;

a screening module, configured to select a capacity prediction result that satisfies a predetermined relevance condition from the capacity prediction results corresponding to the respective frequency signals; and a reconstruction module, configured to reconstruct a predicted battery discharge capacity according to the capacity prediction result that satisfies the predetermined relevance condition.

For the convenience of description, the above devices are described in terms of functions divided into various modules. Of course, when implementing one or more embodiments of the present specification, the functions of the respective modules may be implemented in the same software or hardware.

The device in the foregoing embodiments is used to implement the corresponding method in the foregoing embodiment, and has the beneficial effects of the corresponding method embodiment, which will not be repeated here.

Although the present disclosure is described by accompanying the specific embodiments, based on the forgoing descriptions, lots of alternatives, modifications and variations of the embodiments will be apparent for a person of ordinary skill in the art.

One or more embodiments of the present specification are intended to embrace all such alternatives, modifications and variations that fall within the wide range of the appended claims. Thus, any omission, modification, equivalent replacement, improvement and so on made within the spirit and principle of one or more embodiments the present specification shall be encompassed by the protection scope of the present disclosure.

What is claimed is:

1. A method for capacity degradation prediction of a lithium-ion battery, comprising:
acquiring an original battery discharge capacity;
decomposing the original battery discharge capacity through a predetermined mode decomposition method to obtain battery discharge capacities composed of a plurality of different frequency signals, comprising:
decomposing an original battery discharge capacity S(t) through a CEEMDAN mode decomposition algorithm to obtain a battery discharge capacity composed of a plurality of high-frequency signals and a low-frequency signal, the battery discharge capacity being expressed as:

$$CEEMDAN(S(t))=\Sigma_{i=1}^{k}d_i(t)+r_k(t) \tag{1}$$

in which k is a number of decomposed IMF components; $d_i(t)$ is a high-frequency signal corresponding to the $i^{th}$ IMF component and $r_k(t)$ is a low-frequency signal corresponding to a residual signal;
inputting the respective frequency signals into a pre-constructed capacity prediction model to obtain capacity prediction results corresponding to the respective frequency signals;
selecting the capacity prediction result that satisfies a predetermined relevance condition from the capacity prediction results corresponding to the respective frequency signals, comprising:
calculating a correlation coefficient between each frequency signal and the original battery discharge capacity respectively; selecting the frequency signal whose correlation coefficient is greater than or equal to a preset correlation threshold; and taking the capacity prediction result corresponding to the selected frequency signal as a capacity prediction result that satisfies the predetermined relevance condition, wherein the correlation coefficient is expressed as:

$$\rho_w = \frac{\sum_{t=1}^{n}(S(t)-\overline{S(t)})(d_w(t)-\overline{d_w(t)})}{\sqrt{\sum_{t=1}^{n}(S(t)-\overline{S(t)})^2 \sum(d_w(t)-\overline{d_w(t)})^2}} \tag{15}$$

in which $p_w$ is a correlation coefficient between a $w^{th}$ frequency signal and the original battery discharge capacity; $d_w(t)$ is a frequency signal corresponding to the $w^{th}$ IMF component; $\overline{d_w(t)}$ is a mean of $d_w(t)$; S(t) is the original battery discharge capacity; $\overline{S(t)}$ is a mean of S(t); and n is a total battery charge-discharge cycle time; and
reconstructing the predicted battery discharge capacity according to the capacity prediction result that satisfies the predetermined relevance condition, comprising:
reconstructing the predicted battery discharge capacity according to the capacity prediction result that satisfies the predetermined relevance condition and the capacity prediction result corresponding to the low-frequency signal, the battery discharge capacity being expressed as:

$$S'(t)=\Sigma_{m=1}^{N}d'_m(t)+r_k'(t) \tag{16}$$

in which S'(t) is the reconstructed battery discharge capacity; N is a number of capacity prediction results that satisfy the predetermined relevance condition; $d'_m(t)$ is the $m^{th}$ capacity prediction result that satisfies the predetermined relevance condition; and $r'_k(t)$ is the capacity prediction result corresponding to the low-frequency signal.

2. The method according to claim 1, wherein
the capacity prediction model is constructed based on an ANFIS model; and the inputting the respective frequency signals into the pre-constructed capacity prediction model to obtain capacity prediction results corresponding to the respective frequency signals comprises:
dividing each frequency signal into a training set and a test set, taking the training set and the test set as inputs of the capacity prediction model, and outputting, by the capacity prediction model, the capacity prediction results of the corresponding frequency signals.

3. A device for predicting capacity degradation of a lithium ion battery, comprising:
an acquisition module, configured to acquire an original battery discharge capacity;
a decomposition module, configured to decompose the original battery discharge capacity through a predetermined mode decomposition method to obtain battery discharge capacities composed of a plurality of different frequency signals, comprising:
decomposing an original battery discharge capacity S(t) through a CEEMDAN mode decomposition algorithm to obtain a battery discharge capacity composed of a plurality of high-frequency signals and a low-frequency signal, the battery discharge capacity being expressed as:

$$CEEMDAN(S(t))=\Sigma_{i=1}^{k}d_i(t)+r_k(t) \tag{1}$$

in which k is a number of decomposed IMF components; $d_i(t)$ is a high-frequency signal corresponding to the $i^{th}$ IMF component and $r_k(t)$ is a low-frequency signal corresponding to a residual signal;
a prediction module, configured to input the respective frequency signals into a pre-constructed capacity prediction model to obtain capacity prediction results corresponding to the respective frequency signals;
a screening module, configured to select a capacity prediction result that satisfies a predetermined relevance condition from the capacity prediction results corresponding to the respective frequency signals, comprising:
calculating a correlation coefficient between each frequency signal and the original battery discharge capacity respectively; selecting the frequency signal whose correlation coefficient is greater than or equal to a preset correlation threshold; and taking the capacity prediction result corresponding to the selected frequency signal as a capacity prediction result that satisfies the predetermined relevance condition, wherein the correlation coefficient is expressed as:

$$\rho_w = \frac{\sum_{t=1}^{n}(S(t)-\overline{S(t)})(d_w(t)-\overline{d_w(t)})}{\sqrt{\sum_{t=1}^{n}\sum(S(t)-\overline{S(t)})^2 \sum(d_w(t)-\overline{d_w(t)})^2}} \quad (15)$$

in which $p_w$ is a correlation coefficient between a $w^{th}$ frequency signal and the original battery discharge capacity; $d_w(t)$ is a frequency signal corresponding to the $w^{th}$ IMF component; $\overline{d_w(t)}$ is a mean of $d_w(t)$; $S(t)$ is the original battery discharge capacity; $\overline{S(t)}$ is a mean of $S(t)$; and n is a total battery charge-discharge cycle time; and a reconstruction module, configured to reconstruct a predicted battery discharge capacity according to the capacity prediction result that satisfies the predetermined relevance condition, comprising: reconstructing the predicted battery discharge capacity according to the capacity prediction result that satisfies the predetermined relevance condition and the capacity prediction result corresponding to the low-frequency signal, the battery discharge capacity being expressed as:

$$S'(t)=\Sigma_{m=1}^{N}d'_m(t)+r_k'(t) \quad (16)$$

in which S'(t) is the reconstructed battery discharge capacity, N is a number of capacity prediction results that satisfy the predetermined relevance condition, $d'_m(t)$ is the $m^{th}$ capacity prediction result that satisfies the predetermined relevance condition, and $r'_k(t)$ is the capacity prediction result corresponding to the low-frequency signal.

4. The device according to claim 3, wherein the prediction module is configured to divide each frequency signal into a training set and a test set, take the training set and the test set as inputs of the capacity prediction model, and the capacity prediction model is configured to output the capacity prediction results of the corresponding frequency signals, wherein the capacity prediction model is constructed based on an ANFIS model.

* * * * *